(12) United States Patent
Lehmann et al.

(10) Patent No.: US 6,642,602 B2
(45) Date of Patent: Nov. 4, 2003

(54) SELF-TERMINATING BLOW PROCESS OF ELECTRICAL ANTI-FUSES

(75) Inventors: Gunther Lehmann, Poughkeepsie, NY (US); Ulrich Frey, Poughkeepsie, NY (US); Oliver Weinfurtner, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/017,036

(22) Filed: Dec. 14, 2001

(65) Prior Publication Data

US 2003/0112016 A1 Jun. 19, 2003

(51) Int. Cl.[7] .................. H01L 29/00; H01L 29/04; H01L 21/82; G11C 7/00
(52) U.S. Cl. .................. 257/530; 257/50; 365/225.7; 438/131; 438/467
(58) Field of Search .................. 437/52; 350/34; 365/225.7; 257/530, 50; 324/550; 438/131, 467

(56) References Cited

U.S. PATENT DOCUMENTS

| | | | |
|---|---|---|---|
| 4,752,118 A | 6/1988 | Johnson | 349/54 |
| 4,943,538 A | 7/1990 | Mohsen et al. | 437/52 |
| 6,421,293 B1 * | 7/2002 | Candelier et al. | 365/225.7 |

* cited by examiner

*Primary Examiner*—N. Le
*Assistant Examiner*—Donald M Lair
(74) *Attorney, Agent, or Firm*—Slater & Matsil, L.L.P.

(57) ABSTRACT

An anti-fuse system composed of a multiplicity of anti-fuse circuits (24, 26, 28, N) connected across a voltage source (10) by a pair of conductors (16, 18). Each anti-fuse circuit comprising an anti-fuse (30) connected in a series with a blow or control transistor (36) and a control circuit (44) for monitoring the status of the anti-fuse (30), Control circuit (44) provides an "on" signal to the gate (38) of control transistor (36) only when a__"select__" signal is received at an input (46) of control circuit (44) and if anti-fuse (30) has not been blown. After the anti-fuse (30) is blown, control circuit (44) turns off the control transistor (36) thereby providing a constant power source voltage across each anti-fuse circuit (24, 26, 28, N) regardless of the number of parallel anti-fuses which have been blown.

16 Claims, 3 Drawing Sheets

SELF-TERMINATING BLOW PROCESS OF ELECTRICAL ANTI-FUSES

FIELD OF THE INVENTION

The present invention relates to anti-fuses, and more particularly to circuitry and methods for switching current flow through the anti-fuse off after the anti-fuse has blown.

BACKGROUND OF THE INVENTION

Anti-fuses are semiconductor devices which comprise a thin dielectric layer between two conductors. The unblown anti-fuse is initially an "open" circuit between the two conductors. However, if a sufficiently high voltage pulse is applied across the two conductors to rupture the dielectric, a closed circuit is formed between the two conductors and the anti-fuse is considered to be "blown." U.S. Pat. No. 4,943,538 to Amr M. Mohsen, et al. discloses this type of anti-fuse.

Another form of anti-fuse consists of a region of amorphous material of high resistance sandwiched between two conductors. This type of anti-fuse is "blown" when a sufficient current is passed through the amorphous material so that the high resitivity of the amorphous material changes state and becomes a conductive material. U.S. Pat. No. 4,752,118 to Robert R. Johnson describes this type of anti-fuse. Both types of anti-fuses may be used with the present invention.

There are several devices, such as various memory chips and gate arrays, etc., which can be programmed and even reprogrammed by the use of parallel anti-fuses. Unfortunately, the low power capabilities of on-chip power supplies together with line conductor resistance of prior art anti-fuse circuitry often limits the voltage and/or current at the anti-fuse elements. These limitations can affect the blowing capacities of parallel anti-fuses, and can also prevent the usage of a "test time efficient" parallel fuse blow.

Referring now to FIG. 1, there is shown prior art anti-fuse circuitry having a multiplicity of parallel anti-fuse circuits. As shown, there is a power supply or source 10 having a first output 12, which may for example be a positive output and a second output 14 which may be a negative output connected to conductive paths or electric conductors 16 and 18 respectively. Also shown are resistive units or elements 20 and 22 that represent the electrical line resistance between the power supply or source 10 and the multiplicity of anti-fuse circuits 24, 26, 28 and "N". The resistance units 20 and 22 could include actual resistors intentionally connected in the circuitry, but are primarily intended to represent the power supply connectors or terminals 12 and 14, as well as the line or conductor resistance. Also as shown, each of the multiplicity of anti-fuse circuits are comprised of an anti fuse 30 having connection points or terminals 32 and 34 connected in series with a switching device or transistor 36 which also has a pair of connection points or terminals for conducting a current therethrough when "closed" by an "on" or "activate" signal provided to a control terminal or gate. The switching device or transistor 36 represents an "open" circuit or high impedance when the "activate" or "on" signal is not present. Typically, switching device or transistor 36 will be a "blow transistor" such as an FET (field effect transistors) having a control terminal or gate 38 and source/drain terminals as indicated for example by terminals 40 and 42.

As is understood by those skilled in the art, and referring again to FIG. 1, when an anti-fuse is in an "unblown" state, a high resistance or impedance exists between the anti-fuse terminals 32 and 34. And when the anti-fuse is "blown," it provides an electrical conductor or low resistance path between terminals 32 and 34. If two or more of the parallel anti-fuses are selected to be "blown," an "activate" or "on" signal will be applied to gate 38 of each of the appropriate blow transistors which are in series with the anti-fuse to be blown. As can be seen from the prior art FIG. 1, all of the parallel anti-fuses initially see or are across approximately the same voltage potential. However, once an anti-fuse blows, a significant current flows through the blown fuse 30 and its corresponding blow transistor 36. As a result, there is a voltage drop that occurs across the line or conductor resistance and the power supply connect terminals 12 and 14 represented by resistance units 20 and 22. Consequently, the remaining parallel fuses are not exposed to the full voltage provided by the power source 10. Then, if another fuse blows, the current drawn from power source 10 increases and the voltage across the remaining anti-fuses drops even further. This process, of course, continues as each of the remaining unblown anti-fuses blow until the cumulative voltage drop is so great that the remaining unblown fuses will not blow. This means, of course, that by turning on or activating more than one blow transistor at a time, it is difficult if not impossible to predict and adjust the blow voltage across each fuse element. This of course is unacceptable for those situations where the ability to predict and adjust the necessary voltage to blow the anti-fuses is essential for highly reliable blowing procedures.

In addition, in the prior art anti-fuse circuitry, once an anti-fuse "blows", the current will continue through the anti-fuse 30 and the blow transistor for quite some time. Such a high continuous current often resulted in the anti-fuse circuitry being damaged. For example, the gate oxide of the anti-fuse blow transistor may be destroyed if the current flows for an extended time such as for example one millisecond. When this occurs, a blown anti-fuse might be read as being unblown since the blow transistor can no longer operate properly. Therefore, it would be advantageous if each parallel anti-fuse in a circuit is exposed to the same voltage potential.

It would also be advantageous to reduce the time period that the anti-fuses and the supply conductors or lines for the anti-fuse are exposed to a high amount of current so as to prevent damage to the anti-fuse, supply conductors and associated circuitry.

SUMMARY OF THE INVENTION

The above advantages are achieved in the present invention by methods and anti-fuse circuitry connected to a voltage source used to blow the anti-fuse. At least one anti-fuse has one of its two connection points or terminals electrically coupled to an output of the voltage source. The second output of the anti-fuse being coupled to one of the input/output terminals of a switching device such as, for example, to one of the source/drain terminals of an FET transistor. The second input/output (source/drain) of the switching device is coupled to the other output of the voltage source. The control terminal of the switching device or according to one embodiment, the gate of the FET transistor, receives a control signal which closes the path between the two input and output (source/drain) terminals, or in an embodiment using an FET transistor turns the transistor on to allow a current flow therethrough. Also included in the present invention is a control circuit having a first input connected to a junction, point or node between the anti-fuse and the switching device. A second input of the control circuit receives a signal indicating or selecting the associated or particular anti-fuse to be blown. The control circuit also has an output that is coupled to the control terminal or gate of the switching device so as to turn the FET transistor or other type of switching device on and provide a low conductive path through the switching device or transistor. The control circuitry operates such that in its normal operation mode, the control signal is provided to the switching device or transistor only when the associated anti-fuse has not blown and the signal selecting the particular anti-fuse is present. Consequently, once the fuse is blown, the control signal to the switching device is removed. Thus, the switching device or FET transistor sees a high impedance between its terminals such that the current flow through the anti-fuse ceases. Thus, by turning off the switching device and thereby stopping the current flow, damage to the conductive lines and the oxide of the circuit is prevented while at the same time each of the other or remaining parallel anti-fuses will see the original initial voltage which resulted in the first fuse being blown.

Also disclosed is an anti-fuse system which is comprised of a multiplicity of parallel anti-fuse circuits of the type discussed above. Accordingly, there is included first and second conductors coupled one each to the two outputs of the power or voltage source. The multiplicity of anti-fuse circuits are connected in parallel between the first and second conductors. Each selected anti-fuse will be connected to substantially the same "blow" voltage no matter how many parallel anti-fuses are blown since once an anti-fuse is blown its associated blow transistor is turned off thereby interrupting the current flow through the blown anti-fuse.

DETAILED DESCRIPTION OF PREFERRED EMBODIMENTS

Figure 1:
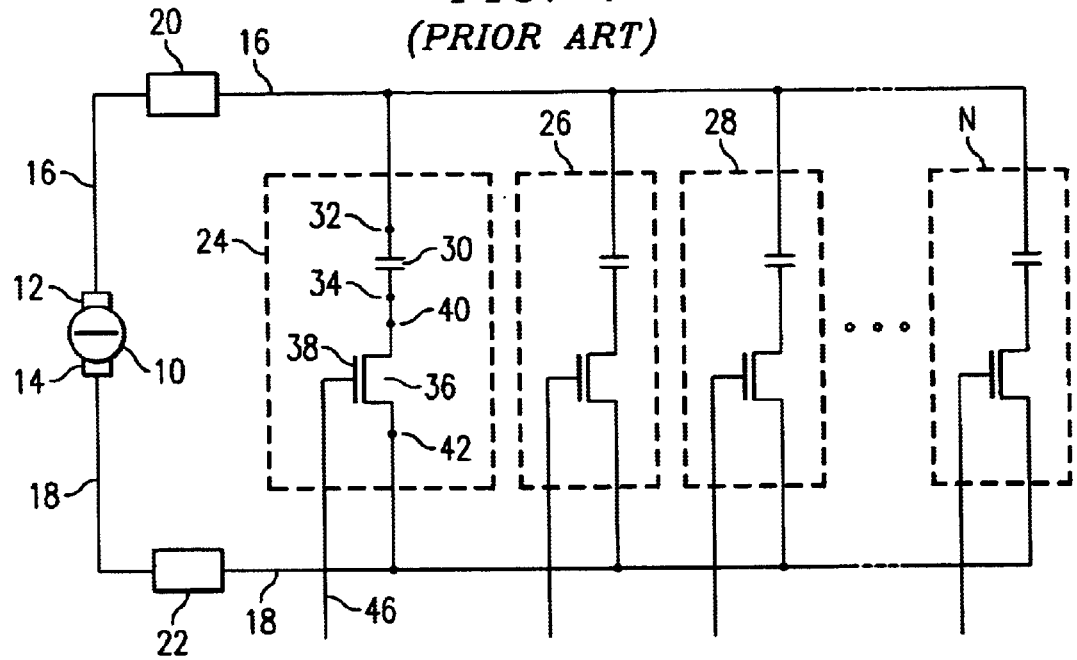
FIG. 1 shows prior art anti-fuse circuitry.
Figure 2:
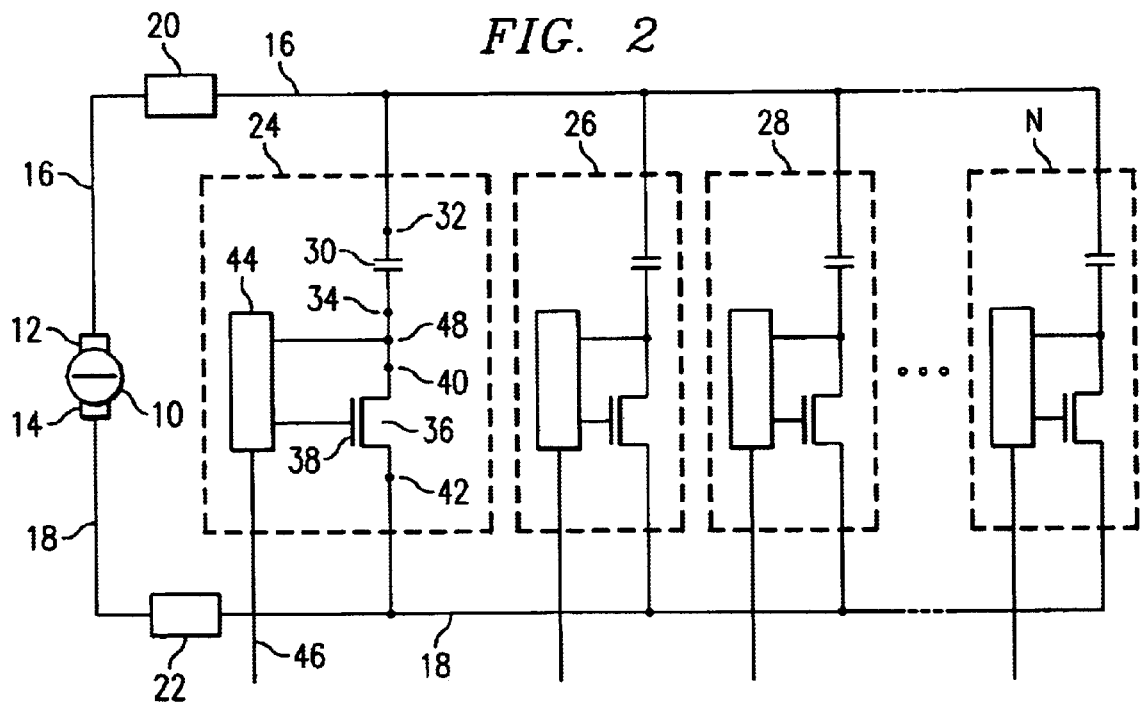
FIG. 2 shows the parallel anti-fuse circuitry of the present invention.

Referring now to FIG. 2, there is shown a general circuit diagram that includes the features of the present invention. As is seen, those elements, common to the prior art circuitry discussed with respect to FIG. 1 and the elements of the present invention will bear the same reference numbers.

As shown in FIG. 2, the parallel anti-fuse circuitry is similar to that of FIG. 1 except that it further includes control circuitry 44. In addition, the signal coming in on line 46 which selects the appropriate anti-fuse to be blown by turning on FET 36 or other switching device, is now provided as an input to control circuitry 44 rather than directly to the gate or other control terminal 38 of the switching device. Control circuitry 44 further includes another input which monitors the voltage level at node 48 electrically located between the anti-fuse 30 and the switching device 36 (e.g. an FET transistor). As will be explained in detail hereinafter, this control circuitry 44 continuously monitors or tracks the voltage level of node 48 to determine the state of the anti-fuse. That is, whether the anti-fuse has been blown or not. Further, as will be discussed, the blow transistor or switching device 36 will be turned on so as to provide a low impedance during the normal operating process (blowing process) only if two conditions exist: the first condition is that a select "signal" has been received on line 46, specifically selecting the anti-fuse 30 to be blown. The second condition is that the monitor input to control circuit 44 indicates that the anti-fuse is still in the unblown state. Thus, the circuitry operates such that the blow transistor or switching device 36 is immediately shut off after the anti-fuse becomes conductive, that is, after it is blown. In addition, as will be discussed, to insure that a voltage change on node 48 (which results when the blow transistor is switched off), is not interpreted as the anti-fuse being in an unblown state, control circuit 44 also operates so that an "activate" or "on" signal to transistor or switching device 36 is latched so that it will not be provided again after the transistor or switch has been turned off.

Figure 3:
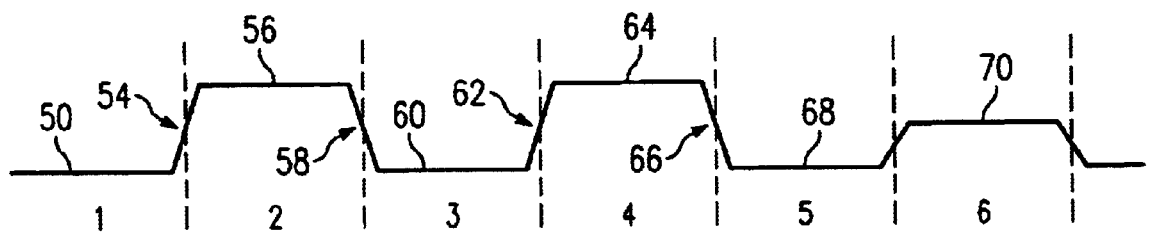
FIG. 3 illustrates the voltage levels at a point or mode of the circuitry of FIG. 2 between the anti-fuse and the switching device or "blow transistor" during a "blow" cycle.

Therefore, referring now to FIG. 3, there is shown a graphical representation of the changing voltage level at node 48 during a complete blow and fuse read cycle from beginning to end. For example, the voltage at node 48 will be low as indicated at 50 prior to the blow voltage or power source 10 being turned on. After the power source 10 is turned on, it provides an output or voltage potential at terminal 32 of the anti-fuse 30. This is true even though the blow transistor 36 is not conducting (i.e. off). Also of course, since this is the beginning state of the blow cycle, the anti-fuse 30 has not yet been blown. Then as shown in FIG. 3, when power source 10 is turned on, the voltage at node 48 increases to a high level as indicated by line 54. This occurs because the switching device or blow transistor 36 is not on and therefore interposes a high resistive path from the anti-fuse to conductive line 18. Thus, both plates of the anti-fuse (typically a capacitor with a very thin dielectric between the two conductors), will begin to charge thereby raising the voltage level at terminal 34 and consequently at node 48. The voltage level of node 48 will remain at a high level as indicated by line 56 until a "select" signal is received at input 46 indicating that this is an anti-fuse that is selected to be blown. It will be recalled that as was discussed earlier, switching device or transistor 36 will not be turned on, i.e. made conductive, unless two conditions exist. The first being that the anti-fuse 30 has not been blown and the second being that the select signal is present on line 46. Therefore, since the anti-fuse has not been blown and the select signal has now been applied, the switching device or transistor 36 will be turned on by an "activate" or "on" signal provided to gate 38 from control circuitry 44. Turning on the transistor 36 discharges the plate connected to terminal 34 of the anti-fuse 30 as the high impedance between the two terminals 40 and 42 of switching device 36 is reduced to a low impedance or conductive state. Consequently, the voltage at the terminal 34 of anti-fuse 30 as well as node 48 decreases substantially to the same voltage as the voltage line 18. This is shown at reference number 58 of FIG. 3. Therefore, there is now a significant voltage potential across the capacitance or plates of anti-fuse 30. This voltage potential across anti-fuse 30 will increase as the voltage level at monitor node 48 decreases (see reference number 58 of FIG. 3) until the rupture point of the anti-fuse is reached. Therefore, as is known by those skilled in the art, blowing of the anti-fuse results in the anti-fuse changing from a high impedance state to a low impedance state. Thus, there is a low impedance or substantially a conductive path between the input/output connection points or terminals 32 and 34 of anti-fuse 30.

Figure 5:
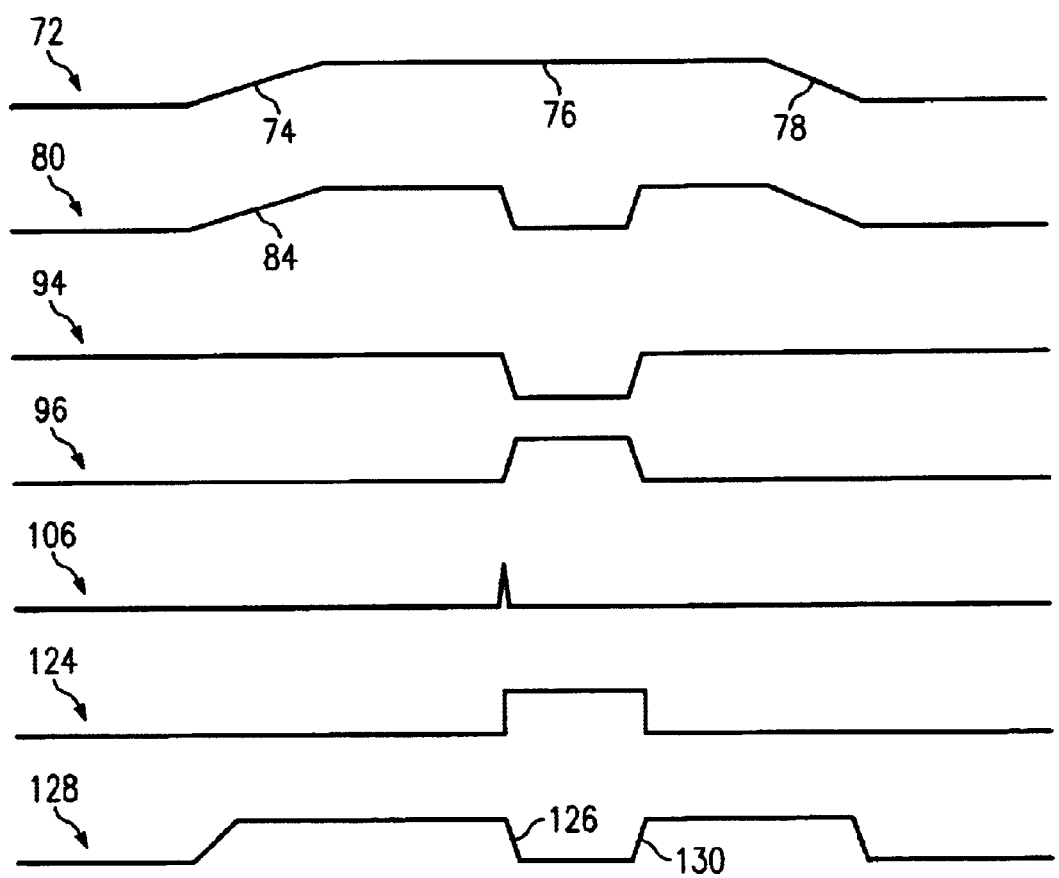
FIG. 5 shows the various voltage levels at different locations of the circuitry of FIG. 4 during the "blow" cycle.

Control circuitry 44 monitoring node 48 tracks the low voltage at node 48 as indicated at 60 of FIG. 3. When the anti fuse becomes conductive, the voltage at node 48 starts to rise, since the anti-fuse creates a connection to power supply line 16. This is interpreted correctly by control circuitry 44 as the anti-fuse 36 having been blown. Thus, one of the conditions necessary for a gate signal or control signal being applied to gate 38 of switching device or transistor 36 is no longer met. Therefore, control circuitry 44 will disconnect or remove the control or gate signal applied to gate 38 of the switching device or transistor 36. Removing the control signal from the gate 38 of transistor 36 turns the switching device or transistor 36 off again thereby changing the conductive state to a high impedance state. Therefore, since the power source or voltage is still on, node 48 monitored by control circuit 44 will continue to rise as indicated by rising line 62 to a high level as indicated by line 64. This high level voltage at node 48 will be maintained until the power source 10 is turned off thereby removing the blow voltage or potential that exists between conductors 16 and 18. Turning off power source 10 is indicated by the falling voltage level shown at 66 on FIG. 3. However, even though the power supply or voltage source continues to provide power until the power source is turned off, there will not now be a current flowing through the anti-fuse 30 which is sufficient to cause damage to the conductive lines and the blow transistor 36. This is because the blow transistor 36 now presents a high impedance between monitor node 48 and conductive line 18. Once the blow voltage or power from power source 10 is turned off, monitor circuit 44 reading node 48 will again track the voltage level falling as indicated in line 66 to a low level as indicated by line 68. The voltage level at node 48 will remain low as indicated by voltage level 68 until a readout transistor is turned on. Readout transistor is turned on to provide an indication to an observer as to the status of the particular anti-fuse. The circuitry for this will be discussed later with respect to FIG. 5. Circuit 44 however latched the information that the anti fuse has been blown already. Therefore, the high level on node 48 as indicated by line 70 will not be interpreted as an unblown anti-fuse. Thus, circuit 44 will keep the blow transistor 36 in its off state.

Figure 4:
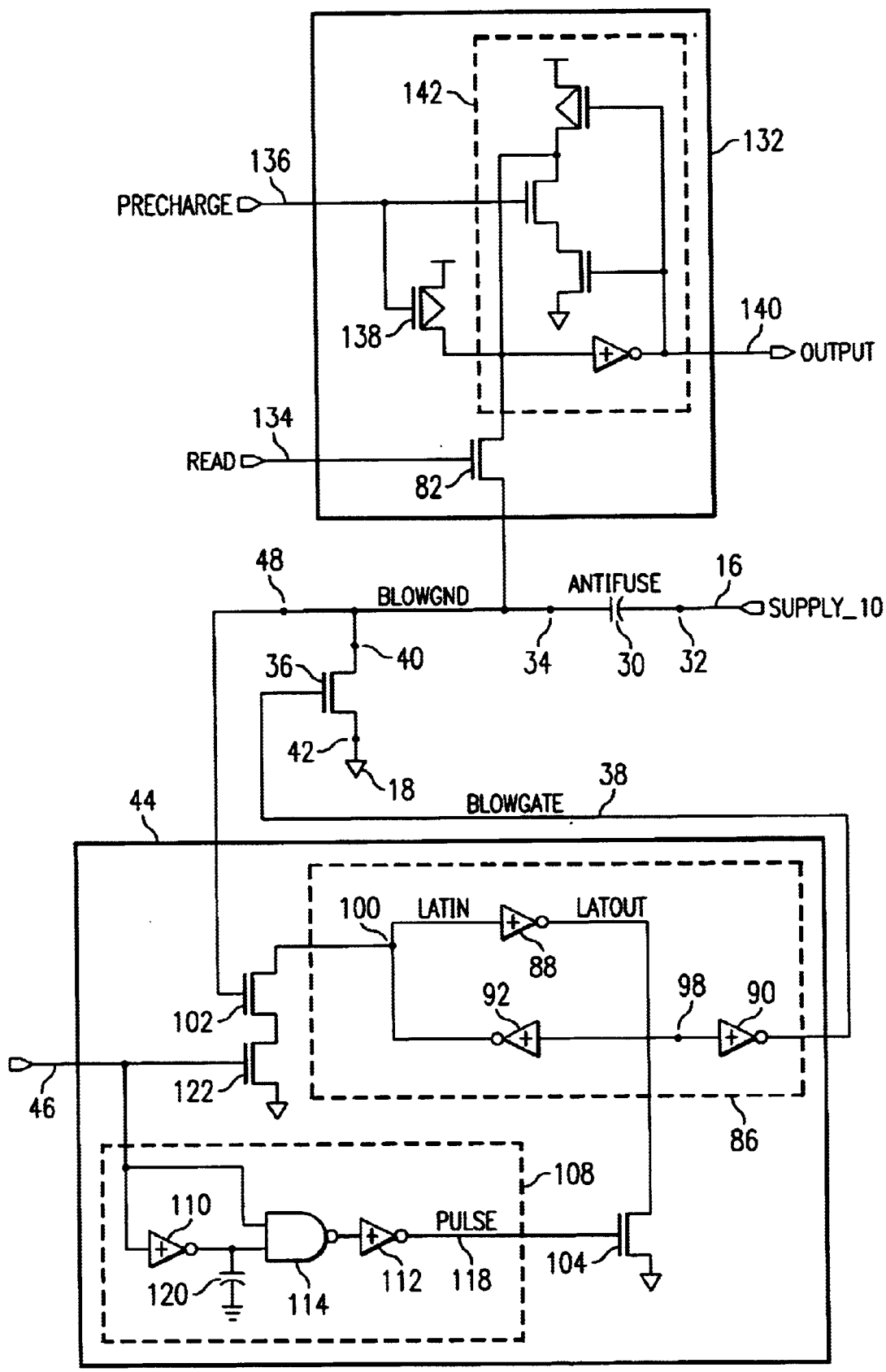
FIG. 4 shows a detailed circuit diagram of one embodiment of the unique anti-fuse circuitry of FIG. 2.

"Referring now to FIG. 4, there is shown a preferred embodiment of the anti-fuse circuitry of FIG. 2, and the relative voltage levels (FIG. 5) at various test points of the circuitry of FIG. 4 during a blow cycle. Those portions of the circuitry which were the same as in FIG. 2 are indicated by similar reference numbers. Therefore, as shown, voltage from voltage source 10 is applied to the circuitry of FIG. 4 across conductors 16 and 18. Conductor or point 18 in the embodiment of FIG. 4 is ground potential. The resulting voltage on line 16 is indicated by the voltage level shown in graph 72. As shown, the voltage is turned on and rises as shown at 74 to maximum level as indicated at 76. After the anti-fuse blow cycle has been completed, the voltage will be removed and begin to decrease as indicated at 78 of graph 72. As can also be seen from graph 80 since the blow transistor 36 or other type of switching device is not conducting (read transistor 82 is also not conducting as will be discussed hereinafter) the voltage potential of anti-fuse 30 (including terminal 34) also increases to a maximum voltage level as indicated at 84 of graph 80. This voltage increase is substantially simultaneous with the voltage level output of the power supply 10 as shown in graph 72. Blow transistor 36 is maintained in an "off" state by a "0" volt potential applied to gate 38 by a latching circuit 86 primarily composed of inverters 88, 90 and 92."

As will be appreciated by those skilled in the art, the arrangement of inverters 88, 90 and 92 is such that a negative signal from latch circuit 86 is applied to the gate 38 of transistor 36. Thus, transistor 36 is maintained or latched in an off or high impedance state. Graphs 94 and 96 illustrate the latch out and latch in voltage levels at test points 98 and 100 respectively. Also shown is transistor 102 which is turned on when the voltage level at node 48 is high. Therefore, likewise, when the voltage level at node 48 is low, transistor 102 is turned off. Thus, it will be appreciated that transistor 36 is maintained at an "off" or high impedance state until the latch output signal at 98 goes low. This, of course, results in the output of inverter 90 going positive which will turn on blow transistor 36. As can be seen, however, the latch output signal will not go low until transistor 104 is turned on and becomes conductive which, of course, substantially connects point 98 to conductor 18 or ground. Further as shown, transistor 104 will be turned on when a short pulse signal is applied to the gate of transistor 104. Also, as will be appreciated, once node 98 is forced low inverters 88 and 92 will switch state and then latch in the new state even after a pulse is removed. The pulse signal applied to the gate of transistor 104 is illustrated by graph 106 of FIG. 5. Therefore, as shown, the select signal on line 46 in the preferred embodiment is provided to a pulse circuit 108. As will be appreciated by those skilled in the electronics art, by using a pair of inverters 110 and 112 along with a nand gate 114, the duration of an output pulse on line 118 may be determined by selecting the capacitance of capacitor 120. The pulse on line 118 having a selected pulse duration is then provided to the gate of transistor 104. It should also be noted that the select "input" on line 46 is also provided to turn on transistor 122 thereby enabling transistor 102 connected to the latching circuitry 92.

When transistor 104 is turned on, the node 98 will go to ground resulting in inverter 90 changing state and providing an output or "on" signal on gate 38 to transistor 36. Graph 124 illustrates the voltage applied to gate 38 of blow transistor 36. When transistor 36 turns "on" or provides a low impedance or conductive path between its source/drain terminals 40 and 42, node 48 also goes low as indicated at 126 by graph 128 thereby providing the full voltage drop across the anti-fuse 30. This, of course, results in anti-fuse 30 blowing or becoming conductive which results in node 48 voltage level increasing again to a high level as indicated at 130 of graph 128. However, latching circuit 86 will switch state again when node 48 goes high and will maintain the switching device or transistor 36 off such that a high voltage level will not indicate that the anti-fuse has not yet been blown.

"The circuitry also includes a conventional readout circuitry 132 for determining if anti-fuse 30 has been blown. The readout circuit is connected to the anti-fuse terminal 34 through transistor 82 which becomes conductive whenever input signal 134 has a "high" voltage. Before a readout operation is performed, voltage source 10 has to be turned off. This causes line 16 and terminal 32 to go low, resembling a connection to ground. The actual readout operation comprises two steps. First, the readout circuit 132 is precharged by applying a low pulse on input signal 136 which turns on transistor 138. This causes the output signal 140 to go low. After the pulse, the latch structure 142 inside circuit 132 will keep the output signal 140 low. The second step of the readout operation is a high pulse on input signal 134. This pulse will create a conductive path between the circuit 132 and the terminal 34 of the anti-fuse via transistor 82. If the anti-fuse has been blown, the circuit 132 will be connected to a ground potential via the transistor 82 and the anti-fuse 30. This will cause the output signal 140 to go high which is indicative of a blown anti-fuse. However, if the anti-fuse has not been blown, the output signal 140 will not change, i.e. retain its low signal. After the end of the high pulse on the input 134, the latching structure 142 inside circuit 132 will keep the state of the output signal 140."

What is claimed is:

1. Anti-fuse circuitry comprising:
    an anti-fuse having a first terminal and a second terminal, said first terminal of said anti-fuse electrically coupled to a first output of a voltage source;
    a switching device having a first terminal coupled to said second terminal of said anti-fuse, a second terminal coupled to a second output of said voltage source, and a control terminal, said switching device providing a conductive path between said first and second terminals of said switching device in response to a first control signal being applied to said control terminal; and
    a control circuit having a first input coupled to monitor a voltage change occurring at said second terminal of said anti-fuse when said anti-fuse changes to a conductive state from a non-conductive state, an output coupled to said control terminal, and a second input for receiving a signal for selecting said anti-fuse, said control circuit operating to provide said first control signal to said control terminal when said anti-fuse has not been blown and said signal for selecting is present and not providing said first control signal to said control terminal when said voltage change indicates anti-fuse has been blown.

2. The anti-fuse circuitry of claim 1 wherein said switching device is a transistor having a high impedance between said first terminal and said second terminal when said first control signal is present, and a low impedance when said control signal is not present, and wherein said control terminal is the gate of said transistor.

3. The anti-fuse of claim 1 and wherein said control circuitry changes the state of said first control signal provided to said switching device after said anti-fuse is blown.

4. The anti-fuse of claim 2 and wherein said control circuitry changes the state of said first control signal provided to said transistor after said anti-fuse is blown.

5. An anti-fuse system comprising:
    first and second conductors connected to first and second outputs of a voltage source; and
    a multiplicity of anti-fuse circuits, individual ones of said anti-fuse circuits comprising:
    an anti-fuse having a first terminal and a second terminal, said first terminal of said anti-fuse electrically coupled to said first conductor;
    a switching device having a first terminal coupled to said second terminal of said anti-fuse, a second terminal coupled to said second conductor, and a control terminal, said switching device providing a conductive path between said first and second terminal of said switching device in response to a first control signal being applied to said control terminal; and
    a control circuit having a first input coupled for monitoring a voltage change occurring at said second terminal of said anti-fuse when said anti-fuse changes to a conductive state from a non-conductive state, an output coupled to said control terminal, and a second input for receiving a signal for selecting said anti-fuse, said control circuit providing said first control signal to said control terminal when said anti-fuse has not been blown and said signal for selecting is present, and not providing said first control signal to said control terminal when said voltage change indicates said anti-fuse has been blown.

6. The anti-fuse circuitry of claim 5 wherein said switching device is a transistor having a high impedance between said first terminal and said second terminal when said first control signal is present and a low impedance when said control signal is not present, and said control terminal is the gate of said transistor.

7. The anti-fuse of claim 5 and wherein said control circuitry changes the state of said first control signal provided to said switching device after said anti-fuse is blown.

8. The anti-fuse of claim 6 and wherein said control circuitry changes the state of said first control signal provided to said transistor after said anti-fuse is blown.

9. Anti-fuse circuitry comprising:
    an anti-fuse having a first terminal and a second terminal, said first terminal of said anti-fuse electrically coupled to a first output of a voltage source;
    switching means responsive to a first control signal coupled between said second terminal of said anti-fuse and a second output of said voltage source, said switching means for selectively providing a conductive path through said switching means; and
    a control circuit having a first input coupled for monitoring a voltage change occurring at said second terminal of said anti-fuse when said anti-fuse changes to a conductive state from a non-conductive state an output coupled to said switching means, and a second input for receiving a signal for selecting said anti-fuse, said control circuit operating to provide said first control signal to said switching means when said anti-fuse has not been blown and said signal for selecting is present, and to not provide said first control signal to said switching means when said voltage change indicates said anti-fuse has been blown.

10. The anti-fuse circuitry of claim 9 wherein said switching means is a transistor having a high impedance between a source terminal and a drain terminal when said first control signal is present, and a low impedance when said first control signal is not present and wherein said transistor includes a gate for receiving said control signal.

11. The anti-fuse of claim 9 wherein said control circuitry changes the state of said first control signal provided to said switching means after said anti-fuse is blown.

12. The anti-fuse of claim 10 and wherein said control circuitry changes the state of said first control signal provided to said transistor after said anti-fuse is blown.

13. An anti-fuse system comprising:
    first and second conductors coupled to first and second outputs of a voltage source; and
    a multiplicity of anti-fuse circuits, individual ones of said anti-fuse circuits comprising:
    an anti-fuse having a first terminal and a second terminal, said first terminal of said anti-fuse electrically coupled to said first conductor;
    switching means coupled between said second terminal of said anti-fuse, and said second conductor, said switching means for selectively providing a conductive path through said switching means in response to a first control signal; and
    a control circuit having a first input coupled to said second terminal of said anti-fuse for monitoring a voltage change occurring at said second terminal of said anti-fuse when said anti-fuse changes from a conductive to a non-conductive state, an output coupled to said switching means, and a second input for receiving a signal for selecting anti-fuse, said control circuit providing said first control signal to said switching means when said anti-fuse has not been blown and said signal for selecting is present, and not providing said first control signal to said switching means when said voltage change indicates said anti-fuse has been blown.

14. The anti-fuse circuitry of claim 13 wherein said switching means is a transistor having a high impedance between a source terminal and a drain terminal when said first control signal is present and a low impedance when said first control signal is not present and said transistor includes a gate for receiving said control signal.

15. The anti-fuse of claim 13 and wherein said control circuitry changes the state of said first control signal provided to said switching means after said anti-fuse is blown.

16. The anti-fuse of claim 14 and wherein said control circuitry changes the state of said first control signal provided to said transistor after said anti-fuse is blown.

* * * * *